United States Patent [19]
Isohata et al.

[11] Patent Number: 5,150,152
[45] Date of Patent: Sep. 22, 1992

[54] EXPOSURE APPARATUS INCLUDING DEVICE FOR DETERMINING MOVEMENT OF AN OBJECT

[75] Inventors: Junji Isohata, Tokyo; Shinji Tsutsui, Kawasaki, both of Japan

[73] Assignee: Canon Kabushiki Kaisha, Tokyo, Japan

[21] Appl. No.: 755,619

[22] Filed: Sep. 5, 1991

[30] Foreign Application Priority Data

Sep. 13, 1990 [JP] Japan .................................. 2-241162

[51] Int. Cl.⁵ ............................................. G03B 27/42
[52] U.S. Cl. ......................................... 355/53; 355/43
[58] Field of Search ................. 355/53, 54, 55, 72, 355/75, 43; 356/358

[56] References Cited

U.S. PATENT DOCUMENTS

| | | | |
|---|---|---|---|
| 4,370,054 | 1/1983 | Isohata et al. | 355/53 |
| 4,422,754 | 12/1983 | Isohata et al. | 355/43 |
| 4,496,239 | 1/1985 | Isohata et al. | 355/53 X |
| 4,676,630 | 6/1987 | Matsushita et al. | 355/53 |
| 4,708,465 | 11/1987 | Isohata et al. | 355/53 |
| 4,748,478 | 5/1988 | Suwa et al. | 355/53 |
| 4,814,830 | 3/1989 | Isohata et al. | 355/54 |
| 4,864,360 | 9/1989 | Isohata et al. | 355/53 |
| 4,878,086 | 10/1989 | Isohata et al. | 355/53 X |
| 4,924,257 | 5/1990 | Jain | 355/53 |
| 4,998,134 | 3/1991 | Isohata et al. | 355/53 |

*Primary Examiner*—Richard A. Wintercorn
*Attorney, Agent, or Firm*—Fitzpatrick, Cella, Harper & Scinto

[57] ABSTRACT

An exposure apparatus for exposing an exposure member or wafer to a pattern with radiation in a step-and-repeat manner thereby to transfer images of the pattern onto different regions on a surface of the exposure member. The apparatus includes an XY stage for moving the wafer in X- and Y-directions, a $\theta$ stage for moving the wafer in a rotational direction relative to the XY stage, laser interferometers for measuring an amount of movement of the wafer by the XY stage, in each of the X- and Y-directions, by use of a mirror member mounted on the $\theta$ stage, and a carriage for carrying the XY and $\theta$ stages and a portion of the interferometers to move the wafer relative to an exposing system for effecting the scan-exposure on the region of the wafer. The mirror member is placed on the $\theta$ stage, and another portion of the interferometers is mounted on a fixed system independent of the carriage. The inclination of the mirror member is detected at any desired time by moving the carriage and calculating the inclination from the amount of movement of the carriage and the amount of displacement of the mirror member measured by the interferometer mounted on the fixed system. Based on the thus detected inclination of the mirror member, the inclination is corrected and the stepwise movement of the XY stage can be performed with a higher accuracy, so that the transfer accuracy between the pattern images printed on the wafer in the case of the step-and-repeat exposure can be highly improved.

23 Claims, 6 Drawing Sheets

EXPOSURE APPARATUS INCLUDING DEVICE FOR DETERMINING MOVEMENT OF AN OBJECT

BACKGROUND OF THE INVENTION

1. Field of the Invention

The present invention relates to an exposure apparatus or aligner for exposing an exposure body to a pattern on an original body, for example, a semiconductor circuit, a liquid crystal TV panel circuit, or the like, and in particular, to such an aligner which is suitable for division exposure wherein a large panel, for example, is exposed in a step-and-repeat manner, thereby transferring images of the pattern on the original body onto different regions on the exposure body with a proper exposure accuracy.

2. Related Background Art

In a mirror projection type semiconductor exposure apparatus, a mask and a substrate or wafer are put on a carriage, and the wafer is exposed to an entire pattern on the mask with radiation by scanning the mask and the wafer relative to a mirror projection system and an illuminating system.

However, in recent years, the diagonal length of the wafer has been enlarged for the purposes of reducing the cost of chips and a need has arisen to fabricate a large-sized liquid crystal display panel for liquid crystal TVs and the like, and thus the pattern image plane has been made large in size. Therefore, needs have been brought forth to augment the range of exposure and to extend the scan length, so that the size of exposure apparatuses has inevitably been made large.

To cope with this tendency, a step-and-scan or step-and-repeat exposure system has been presented for dividing the image plane on the wafer into a plurality of different imaginary areas and conducting a scan-exposure of each the different areas on the wafer to the pattern on the mask each time a different area on the wafer is stepwise moved under an exposure station.

Referring to FIG. 1, a first prior art exposure apparatus wil be explained which was has been presented as such a step-and-repeat type aligner (this will be referred to as a first prior art apparatus hereinafter). In FIG. 1, designated by reference numeral 1 is a photomask on which an exposure pattern or print image is formed, and the mask 1 is carried on a mask stage 2 which is movable in the X-, Y- and $\theta$-directions. The X- and Y-directions are two rectilinear directions which are orthogonal to each other, while the $\theta$-direction is a rotational direction in a plane containing the X- and Y-directions. Designated by reference numeral 3 is a glass substrate or plate on which multiple pixels and switching transistors for on-off control of these pixels are to be formed by a conventional photolithographic process for constructing a liquid crystal display panel and which has a rectangular square shape whose diagonal length is about 14 inches. The substrate 3 is carried on a substrate stage 4 which is movable in the X-, Y- and $\theta$-directions. The stepwise movement of the substrate stage 4 is controlled by a precise length-measuring system which uses laser receivers 61, 62 and 63 of a laser interferometer, as shown in FIG. 6.

Further, in FIG. 1, denoted by reference numeral 5 is a conventional mirror projection optical system which includes a combination of concave and convex mirrors and, at one-to-one magnification, projects on the substrate 3 the pattern image of the mask 1 that has been brought to a prescribed position or exposure station by the mask stage 2. Designated by reference numeral 6 is an illumination optical system for illuminating the mask 1 in the exposure station with radiation of a given wavelength from a light source (not shown), and this illumination system 6 exposes a photosensitive layer on the substrate 3 to the pattern on the mask 1 to transfer this pattern onto the substrate 3. The optical axis of the projection optical system 5 is aligned with that of the illumination system 6.

Further, in FIG. 1. there are provided linear air bearing (LAB) assemblies 7 and 7 which are respectively slidable along two rail guides 8 and 8 formed in the Y-direction, and one of which (right one) is an X- and Z-direction constraint type (i.e., constrained with respect to movement in the X- and Z-directions) and the other (left one) is a Z-direction constraint type. The LAB's 7 and 7 support a holder or carriage 9 for carrying the mask stage 2 and the substrate stage 4 maintaining a prescribed relationship therebetween, so as to make it possible to move the mask 1 on the mask stage 2 and the substrate 3 on the substrate stage 4 as a unit.

Finally, denoted by reference numeral 11 is a mask feeding apparatus for sequentially feeding the masks 1 to the mask stage 2, and denoted by reference numeral 12 is a gap sensor for detecting the gap between the focal plane of the projection system 5 and the surface of the substrate 3, which is, for example, an air micrometer, or a photoelectric type sensor for detecting such a gap using light reflected from the substrate 3, and denoted by reference numeral 13 is a base member for supporting the exposure system 5, illumination system 6 and guide rails 8 and 8 in a predetermined interrelationship.

In the first prior art apparatus of FIG. 1, the surface of the substrate 3 is divided into, e.g., four imaginary exposure regions or parts, and these exposure regions are sequentially brought to the exposure station under the mask 1 and the projection system 5 by the stepwise movement of the substrate stage 4. Thus, the exposure of the mask pattern is conducted four times on the four different regions of the substrate 3, and the pattern of the liquid crystal display panel corresponding to one layer thereof is printed on the whole surface of the substrate 3. The carriage 9 carries the substrate stage 4 together with the mask stage 2 in order to scan the mask 1 and substrate 3 quickly and precisely relative to the projection system 5 and illumination system 6 and conduct the step-and-scan exposures.

As shown in FIG. 6, an L-shaped or right-angled mirror 43 (hereinafter referred to as a square) is mounted on a $\theta$-table 42 of the substrate stage 4, and the distances to the square 43 in the X- and Y-directions are measured by laser interferometers 61, 62 and 63 to monitor the X and Y coordinates of the substrate stage 4 and substrate 3 when the substrate 3 is moved stepwise.

In the first prior art apparatus, however, there exists a disadvantage that such a shift or difference as is shown in FIG. 7 may occur between the individual patterns which have been printed on the substrate 3 in the step-and-repeat manner, especially at the time of pattern transfer of a first mask onto a first layer of the substrate 3. This is because no alignment mark has yet been formed on the substrate 3 so that alignment of the substrate with respect to the first mask is not attainable. On top of that, the laser interferometer measures a relative distance from a certain reference position and the position of the square 43 at the time of switching on the power source or the start of the exposure apparatus is usually set as this reference. As a result, the above shift or difference is likely to occur.

In more detail, if the square 43 is inclined by an angle $\theta$ relative to the X and Y slide axes of the substrate stage 4 (XY table 44 shown in FIG. 3) as shown in FIG. 6, the square 43 moves from a position depicted by a solid line to a position depicted by a broken line when the substrate stage 4 has been moved by a distance L in the X-direction based on the values measured by the receivers 61 and 62 of the laser interferometer. But, at this time, the value measured by the receiver 63 will deviate from a correct value by $\Delta Y = L \cdot \tan \theta$, and hence the substrate stage 4 will erroneously be moved by a distance $-\Delta Y$ in the Y direction by an unshown substrate stage driving circuit in order to correct the position of the substrate stage 4 deviating by a distance $\Delta Y$ in the Y direction. Likewise, when the substrate stage 4 has been moved in the Y direction, the position of the substrate stage 4 in the X direction will fluctuate by an the amount $\Delta X$. The above first prior will art apparatus is disclosed in the U.S. Pat. No. 4,814,830 (Isohata et al.; issued Mar 21, 1989).

To overcome this problem, there has been proposed an exposure apparatus or aligner (referred to as a second prior art apparatus hereinafter) as follows. In this second prior art apparatus, at the time of switching on the power source or at any desired time, the inclination of the square 43 mounted on the stage will be detected relative to the X and Y slide axes, and when the stage is moved, the amount of displacement in the X and Y directions is to be corrected according to that detected inclination to improve the stage feed accuracy. This second prior art apparatus is disclosed in the U.S. Pat. No. 4,676,630 (Matsushita et al.; issued Jun 30, 1987).

In the second prior art apparatus, at the time of switching on the power source or at any desired time the inclination of the square 43 is measured from the amount of movement of the XY stage 44 in one direction and the amount of displacement in a direction orthogonal to this one direction, and the XY stage 44 is stepwise moved or fed based on the result of those measurements.

However, in this system, when the reproducibility of the moving accuracy of the stage 44 in a yawing direction is poor, an error occurs in the measurement of the square's inclination, corresponding to the reproducibility. Thus, the difference or shift between pattern images still occurs, as shown in FIG. 7.

In general, the reproducibility of the movement accuracy of the XY stage 44 in the yawing direction is about 0.5", so that an error in measurement of the square's inclination or tilt of 0.5" will occur. When the error in inclination measurements of 0.5" occurs, the amount of the difference between patterns as shown in FIG. 7 will be 100 mm $\times \tan 0.5" \approx 0.24$ $\mu$m in the case of a step movement of 100 mm.

SUMMARY OF THE INVENTION

An object of this invention is to provide an exposure apparatus in which the measurement of inclination of a square or indicator member is performed with a higher accuracy, and the difference, offset or shift between pattern images on a substrate or exposure object can be reduced without any need to use an XY stage or holding means having a very high reproducibility of movement accuracy in a yawing direction.

According to one aspect of the present invention, a projection exposure apparatus in which, after positions of an original body and an exposure body have been adjusted, the original and exposure bodies are scanned as a unit relative to a projection optical system to transfer a pattern on the original body onto the exposure body, the exposure apparatus includes means for holding the exposure body, said holding means being rotatable in a predetermined plane and rectilinearly movable parallel to the predetermined plane; first measuring means for measuring movement of said holding means, by use of optical interference; scanning means for performing a scanning operation of the original and exposure bodies in a scanning direction relative to the projection system, said scanning means carrying said holding means and said first measuring means; second measuring means disposed on a fixed system on which the projection system is mounted, independent of said scanning means, for measuring a movement or displacement distance of said holding means in a direction different from the scanning direction, by use of optical interference; light reflecting means mounted on said holding means, said reflecting means cooperating with said first and second measuring means to measure the movement or displacement of said holding means; and means for determining an inclination of said light reflecting means, when said scanning means is scanned in the scanning direction by a predetermined distance, from this predetermined distance in the scanning direction and an amount of displacement of said reflecting means in the direction different from the scanning direction measured by said second measuring means.

According to another aspect of the present invention, an exposure apparatus for printing a pattern on a first object onto a second object comprises means for carrying the first object; illuminating means for illuminating the second object through the first object; stage means for holding the second object, said stage means being mounted on said carrying means and movable relative thereto; base means for mobably supporting said carrying means in a first direction, said illuminating means being fixed to said base means in a prescribed relationship; means for indicating a location of the second object held on said stage means, said indicating means being mounted on said stage means; first measuring means for measuring the location of said indicating means, said first measuring means being mounted on said carrying means; second measuring means for measuring the location of said indicating means with respect to a second direction different from the first direction when said carrying means is moved in the first direction, said second measuring means being mounted on said base means; and means for determining an inclination of said indicating means relative to the first and second directions when said carrying means is moved in the first direction, based on a movement distance of said carrying means and a value measured by said second measuring means.

According to still another aspect of the present invention, an apparatus for exposing, in sequence, different portions of an exposure body to a pattern with radiation comprises means for exposing, one at a time, each one of the different portions of the exposure body to the pattern with radiation; means for movably holding the exposure body; means for carrying said holding means; means for slidably supporting said carrying means in a first direction; means for indicating a location of the exposure body held by said holding means, said indicating means being mounted on said holding means; means for measuring a displacement of said indicating means in a second direction different from the first direction when said carrying means is slid in the first direction by a prescribed amount, said measuring means being mounted on said supporting means; means for controlling said holding means to cause said holding means in place, in sequence, the different portions of the exposure body in a predetermined exposure station, taking into account the measured displacement of said indicating means and the prescribed amount of sliding of said carrying means.

According to yet another aspect of the present invention, an apparatus for measuring movement of an object, the apparatus includes means for movably holding an object; means for carrying said holding means; means for slidably supporting said carrying means in a first direction; means for indicating a location of the object held by said holding means, said indicating means being mounted on said holding means; and means for measuring displacement of said indicating means in a second direction different from the first direction when said carrying means is slid in the first direction by a prescribed amount, said measuring means being mounted on said supporting means.

These advantages and others will be more readily understood in connnection with the following detailed description, claim and drawing.

DETAILED DESCRIPTION OF THE PREFERRED EMBODIMENT

Figure 1:
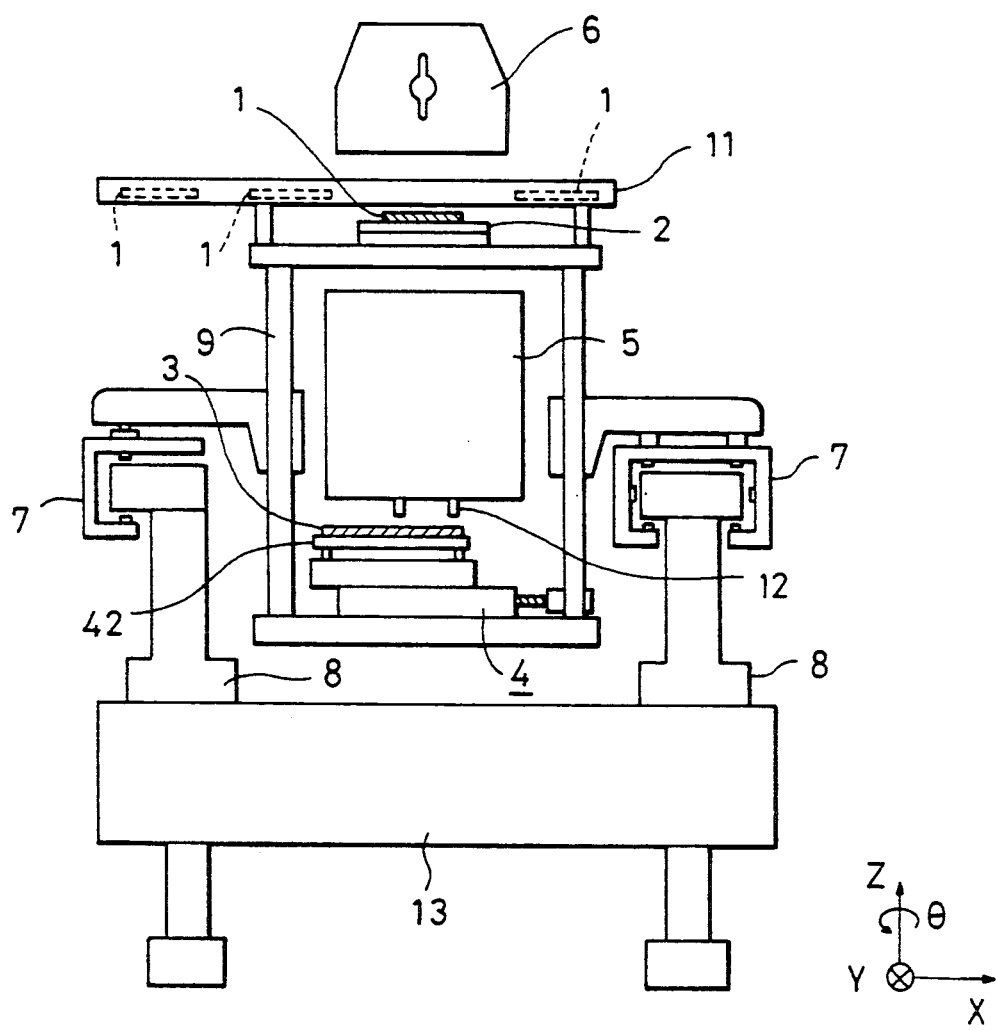
FIG. 1 is a schematic view showing the structure of first and second prior art apparatuses to which the present invention can be applied.

FIG. 1 shows an overall structure of a mirror projection exposure apparatus to which the present invention can be applied.

Figure 2:
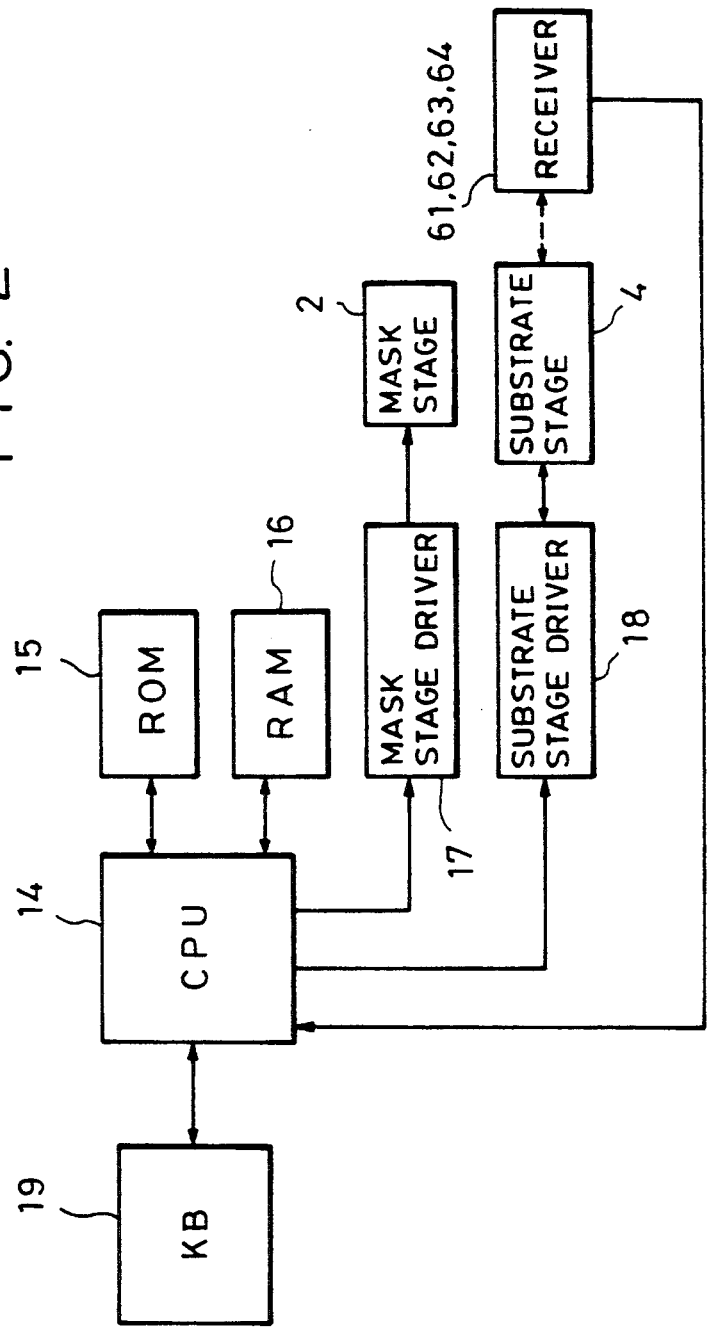
FIG. 2 is a block diagram of an electric circuit structure in the embodiment of this invention.
Figure 4:
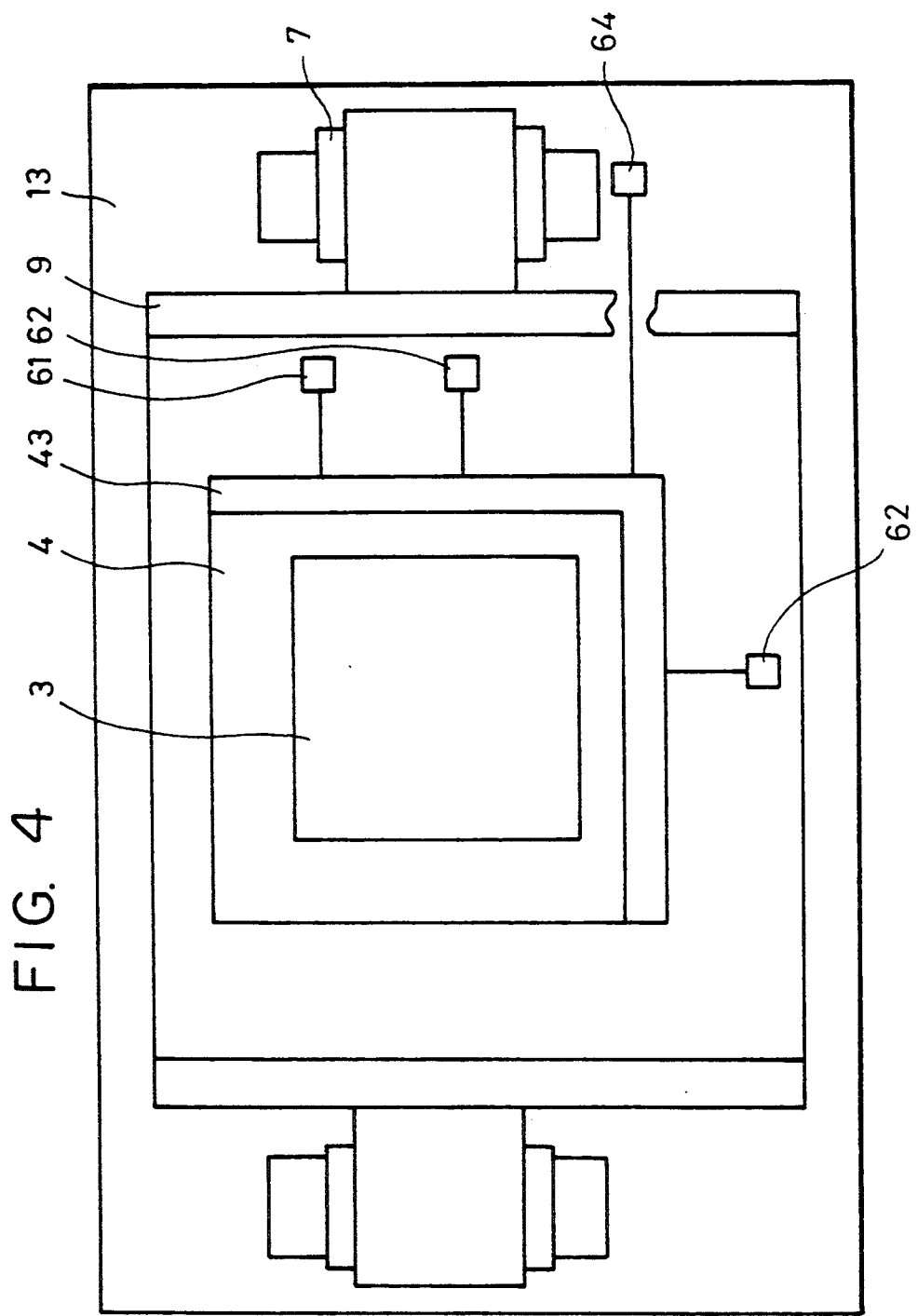
FIG. 4 is a plan view of a main portion of the embodiment of this invention.
Figure 6:
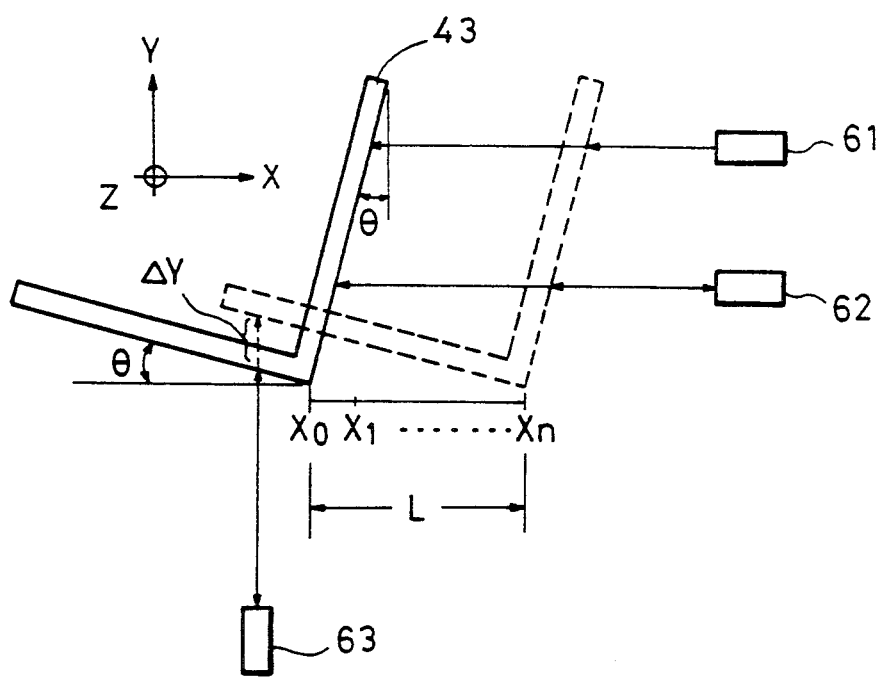
FIG. 6 is a view for explaining the behavior of a substrate stage when a square is inclined in the second prior art apparatus.

FIG. 2 shows an electric circuit structure of the present invention which can be applied to an exposure apparatus, such as that shown in FIG. 1. In FIG. 2, there are provided a central processing unit 14 (CPU) for controlling the operation of an entire exposure apparatus, a read only memory 15 (ROM) in which the control program of the CPU 14 is stored, a random access memory 16 (RAM) for temporarily storing various kinds of data generated when the CPU 14 effects the control program, a mask stage driver 17, a substrate stage driver 18 and a keyboard 19. Reference numerals 2 and 4 respectively designate mask and substrate stages similar to those in FIG. 1, and reference numerals 61, 62, 63 and 64 respectively designate receivers of a laser interferometer wherein the receivers 61, 62 and 63 are similar to those shown in FIG. 6. The structure of the electric circuit of this embodiment is similar to that as shown in FIG. 6, but this embodiment is different from the prior art apparatuses in that the receiver 64 is added, as shown in FIG. 4. However, operations are entirely different between the present invention and those of the conventional apparatuses since the control programs stored in the ROM 15 differ from one another.

Figure 3:
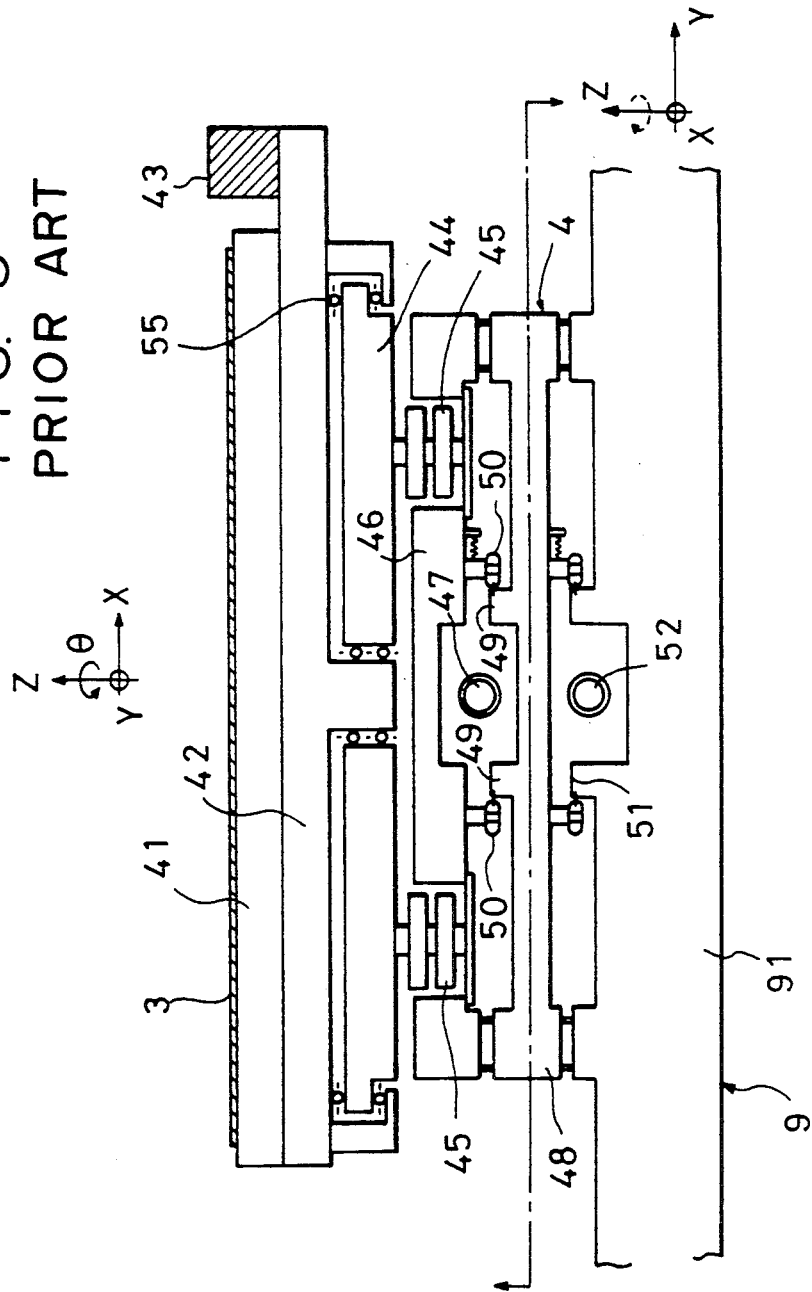
FIG. 3 is a side sectional view of FIG. 1 showing a main portion to which the embodiment of this invention can be applied.

FIG. 3 is a schematic sectional view of a substrate stage in the exposure apparatus of FIG. 1 viewed along the Y-direction. In FIG. 3, there are provided a chuck 41 for holding the substrate 3 on the substrate stage 4, a $\theta$ table 42 for rotating the substrate 3 in the XY plane along with the chuck 41 and the square or L-shaped mirror 43, an XY table 44 to which the $\theta$ table 42 is rotatably mounted through ball bearings 55, an actuator 45 for performing focus and tilt adjustments by moving the substrate 3 in the Z-direction, which comprises a piezoelectric element and so forth, and a Y slider 46 which moves along a Y guide 49 formed on a X slider 48 in response to the rotation of a ball screw 47 driven by an unshown motor. The XY table 44 is fixed to the Y slider 46 through the actuator 45. Further, a slider piece 50 is provided for guiding the Y slider 46 along the Y guide 49. The X slider 48 moves in the X-direction along an X guide 51 formed on the upper surface of a base part 91 of the carriage 9 in the X-direction, in response to the rotation of a ball screw 52 driven by an unshown motor. In FIG. 3, from a lower half of the X slider 48 (indicated by a chain line) to the carriage base 91, a section viewed along the X-direction is shown.

Before explaining the operation of this embodiment, the operation of the second prior art apparatus will be explained in more detail for the purposes of ready comprehension.

In the second prior art apparatus, as a part of initializing, at a time of starting the exposure apparatus, or upon the input of an instruction from the keyboard to discriminate the position of the square 43, the following operation for discriminating the square's position will be performed.

As the square 43 is moved from $X_o$ to $X_n$ as shown in FIG. 6, the displacement $\Delta Y_1, \Delta Y_2, \ldots, \Delta Y_n$ of the square 43 in the Y-direction (see FIG. 6) will be obtained from the measured value of the receiver 63 at each point $X_1, X_2, \ldots, X_n$ measured by the receiver 61 or 62. Then, the inclination $\theta$ of the square 43 will be calculated by a method of least squares. That is, such as inclination $\theta$ that minimizes $\Sigma (Xk \tan \theta - \Delta Yk)^2$ will be obtained by the circuits of FIG. 2, and this is adopted as the inclination of the square 43.

The reason for obtaining the inclination $\theta$ by the method of least squares is that measured values would greatly disperse depending on the measurement points if the inclination $\theta$ was simply obtained as $\theta = \tan^{-1} \Delta Yk/Xk$, when the substrate stage 4 yaws appreciably. However, when the inclination $\theta$ itself is extremely small and the above dispersion is negligible, or when the mechanical precision of a moving mechanism for the substrate stage 4 and rigidity of component members are high and hence the yawing is very little, etc., the inclination $\theta$ may naturally be obtained, for example, as $\theta = \tan^{-1} \Delta Yn/Xn$ from the measured values at one point.

After the inclination $\theta$ of the square 43 has been detected as noted above, the substrate stage 4 is stepwise moved adding the correction resulting from the inclination $\theta$. The correction is conducted, e.g., by simply offsetting the feed amounts in the X- and Y-directions by a $\Delta X = Ly \tan \theta$ and $\Delta Y = Lx \tan \theta$, corresponding to predetermined step feed amounts (Lx, Ly). Or, instead of this offsetting, before starting the ordinary operations, the $\theta$ table 42 will be rotated by the detected inclination $\theta$ of the square 43 so that the orientation of the square 43 may be coincident with the XY slide axes.

Figure 7:
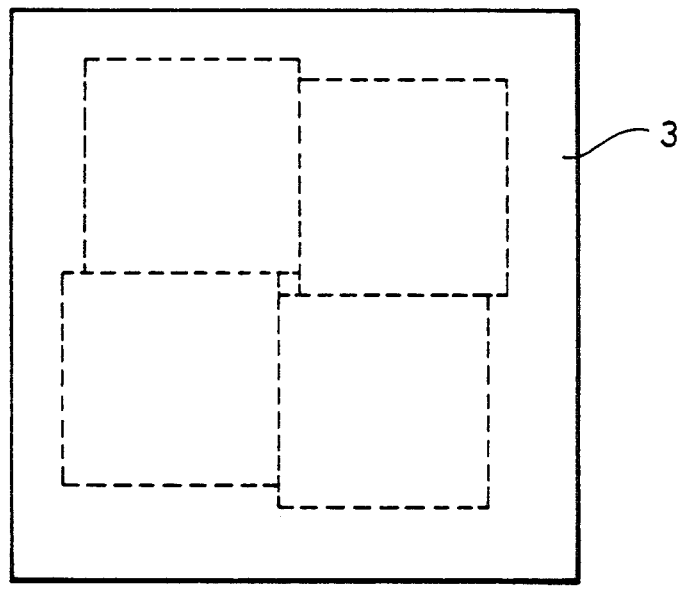
FIG. 7 is a plan view showing an example of the exposure condition of a substrate when the exposure of a mask to patterns is performed in the step-and-repeat manner in the first prior art apparatus.

In the second prior art apparatus, it is proposed that at the time of starting the exposure apparatus or at any desired time, the inclination of the square is calculated from the amount of advance movement in one direction of the XY stage and the amount of displacement in a direction orthogonal to this advance movement direction. However, as described above, in the second prior art apparatus, when the reproducibility of the movement accuracy in the yawing direction of the stage is insufficient or poor, an error in the square's inclination measurement occurs by an amount corresponding to that reproducibility and the difference or shift between pattern images as shown in FIG. 7 appears.

In this embodiment, to overcome this problem the measurement of the square's inclination is performed with a higher accuracy.

FIG. 4 shows a plan view of the apparatus of FIG. 1 to which the present invention is applied. The receiver 61 measures the distance to the square 43 in the X-direction, the receiver 62 measures the angle of the square 43 in cooperation with the receiver 61 and the receiver 63 measures the distance to the square 43 in the Y-direction. All of these interferometer receivers 61, 62 and 63 are mounted on the carriage 9.

On the other hand, the receiver 64 measures the distance to the square 43 is the X-direction, and this receiver 64 is carried on the base member 13 independent of the carriage 9. While the moving or sliding direction of the carriage 9 is the Y-direction, the direction along which the interferometer receiver 64 measures the distance to the square 43 is different from the Y-direction, i.e., in this case, the X-direction. The reason for disposing the interferometer receiver 64 on the base member 13, but not on the carriage 9 is as follows. The stage 4 is relatively heavy (e.g., on an order of 40 kg), but on the other hand, lightness in weight of the carriage 9 is desired since it must perform scanning movement during the scan-exposure of one portion of the wafer 3, and both the wafer 3 and the mask 1 relative to the projection and illuminating optical systems 5 and 6. So, the carriage 9 is prone to deformation and the like. In addition, the carriage 9 is floatingly, supported by the LAB assemblies 7. Further, the stage 4 itself is made light as compared with those used in conventional lens projection type exposure apparatuses, so as to be carried by the carriage 9 with a tolerable burden. As a result, the stage 4 is not very stiff. Consequently, these factors lead to a high possibility of yawing of the stage 4 and hence, inclination $\theta$ error between the mask 1 and wafer 3 due to deformation of the carriage 9, inclination thereof by the application of an uneven load to the LAB 7, deformation of components of the stage 4 and the like, when the stage 4 is moved. Therefore, when inclination of the square 43 is to be measured, this is done by moving the carriage 9, but not the stage 4, accurately or without any appreciable yawing in the Y-direction and measuring the displacement of the square 43 in the X-direction by the receiver 64. Hence, the interferometer receiver 64 should be placed on the stationary base member 13 independent of the moving carriage 9.

Figure 5:
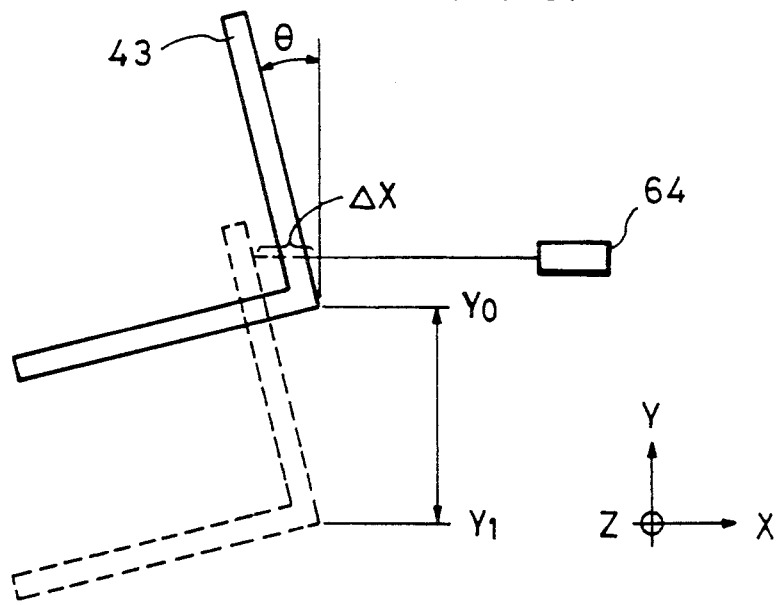
FIG. 5 is a view for explaining the displacement of a square in the X-direction when the carriage is moved in the Y-direction, when the square is inclined or deflected, in the embodiment of this invention.

The operation of this embodiment is as follows. In this aligner, as a part of the initializing at the time of switching on the power source, or upon the input of an instruction to determine the square's position from the keyboard 19, the following operation for discriminating the square's position will be started. First, as the carriage 9 is moved from $Y_0$ to $Y_1$ as shown in FIG. 5, the difference $\Delta X$ of positions in the X-direction at this time is obtained from values measured at two points by the receiver 64.

Then, the inclination $\theta$ of the square 43 is calculated using the following formula:

$$\theta = \tan^{-1} \Delta X/(Y_1 - Y_0).$$

After the inclination $\theta$ of the square 43 has thus been detected, the substrate stage 4 will stepwise be moved, taking into account the correction for eliminating this inclination $\theta$. This correction is performed, for example, by respectively offsetting the feed amounts in the X and Y directions by $\Delta X = Ly \tan \theta$ and $\Delta Y = Lx \tan \theta$, corresponding to the step feed amount (Lx, Ly). Otherwise, instead of this offsetting, before the ordinary operation is begun, the $\theta$ table 42 is rotated by the detected inclination $\theta$ of the square 43 to align the orientation of the square 43 with the moving or sliding axis of the carriage 9.

Thus, since the receiver 64 of the laser interferometer for measuring the displacement amount in the direction orthogonal to the scan direction which occurs when the original body or mask and the exposure body or wafer are scanned integrally or as a unit, is disposed independent of the moving members, namely, on the side of a fixed system including the projection optical system 5 and the base member 13, any measurement error of the square's inclination resulting from poor reproducibility of the movement accuracy of the XY stage 4 in the yawing direction can be reduced.

As described above, according to this invention, the problems of the second prior art apparatus can be solved, that is, the inclination measurement error of the square 43 resulting from the reproducibility of the moving accuracy of the stage in the yawing direction can be reduced.

This advantage of reduction of the measurement error is particularly remarkable in the structure of the above embodiment.

In the above, embodiment, the guide means 7 for moving the carriage 9 includes a hydrostatic bearing or air bearing. In the case of a hydrostatic bearing, the reproducibility of the moving accuracy in the yawing direction is about 0.05", and this value is extremely small, compared to that of the XY stage of about 0.5". Therefore, while the inclination measurement error of the square 43 is about 0.24 $\mu$m in the second prior art apparatus as mentioned above, in the above embodiment, the inclination measurement error this will become 100 mm $\times \tan 0.05" = 0.024$ $\mu$m in the case of 100 mm step movement, and thus will become very small.

Consequently, according to the present invention, the exposure accuracy between pattern images printed on the wafer in the case of the step-and-repeat or division exposure can be highly improved. Also, suppression of inclination $\theta$ deviation of the substrate or wafer upon completion of the step feeding leads to a reduction in the time required for alignment thereof with respect to the original or mask, with the result that the throughput of the apparatus is improved.

While in the foregoing, the present invention has been described with reference to an exposure apparatus of mirror projection type, this invention is also applicable to other types of exposure apparatuses, such as proximity type exposure apparatuses, contact type exposure apparatuses, lens projection type exposure apparatuses or steppers.

While there have been shown and described what are considered preferred embodiments of the present invention, it will be apparent to those skilled in the art that various changes and modifications may be made therein without departing from the invention as defined by the following claims.

What is claimed is:

1. A projection exposure apparatus in which, after positions of an original body and an exposure body have been adjusted, the original and exposure bodies are scanned as a unit relative to a projection optical system to transfer a pattern on the original body onto the exposure body, said apparatus comprising:
   holding means for holding the exposure body, said holding means being rotatable in a predetermined plane and being rectilinearly movable parallel to the predetermined plane;
   first measuring means for measuring movement of said holding means, by use of optical interference;
   scanning means for performing a scanning operation of the original and exposure bodies in a scanning direction relative to the projection system, said scanning means carrying said holding means and said first measuring means;
   second measuring means disposed on a fixed system on which the projection system is mounted, independent of said scanning means, for measuring a movement distance of said holding means in a direction different from the scanning direction, by use of optical interference;
   light reflecting means mounted on said holding means, said reflecting means cooperating with said first and second measuring means to measure the movement of said holding means; and
   determining means for determining inclination of said light reflecting means, when said scanning means is scanned in the scanning direction by a predetermined distance, based on the predetermined distance in the scanning direction and an amount of displacement of said reflecting means in the direction different from the scanning direction measured by said second measuring means.

2. A projection exposure apparatus according to claim 1, wherein said holding means comprises a $\theta$ stage for carrying the exposure body and being rotatable in the predetermined plane and an XY stage for carrying said $\theta$ stage and being movable in two mutually orthogonal directions in the predetermined plane.

3. A projection exposure apparatus according to claim 2, wherein first measuring means comprises a laser interferometer for measuring the movement distance of the exposure body due to the movement of said stages.

4. A projection exposure apparatus according to claim 2, wherein said reflecting means comprises a right-angled mirror which is mounted on said $\theta$ stage.

5. A projection exposure apparatus according to claim 1, wherein said second measuring means comprises a laser interferometer.

6. A projection exposure apparatus according to claim 1, wherein said determining means comprises means for calculating the inclination $\theta$ according to the equation: $\theta = \Delta X/(Y_1 - Y_0)$ where $\Delta X$ is the amount of displacement and $Y_1 - Y_0$ is the predetermined distance in the scanning direction.

7. A projection exposure apparatus according to claim 2, wherein said XY stage moves the exposure body stepwise while correcting the inclination of said reflecting means by respectively offsetting movement amounts in the two orthogonal directions X and Y based on calculations of Ly·tan $\theta$ and Lx·tan $\theta$ where Ly is the feed amount in the Y direction, Lx is the feed amount in the X direction and $\theta$ is the inclination of said reflecting means.

8. A projection exposure apparatus according to claim 2, wherein said $\theta$ stage is capable of being rotated by the inclination of said reflecting means prior to an exposure operation.

9. A projection exposure apparatus according to claim 1, wherein said scanning means is activated to perform a scanning operation for obtaining the inclination of said reflecting means upon switching on of a power source for supplying power to the exposure apparatus.

10. A projection exposure apparatus according to claim 1, wherein said scanning means is activated to perform a scanning operation for obtaining the inclination of said reflecting means upon input of instruction for determining the inclination of said reflecting means.

11. A projection exposure apparatus according to claim 1, further comprising a hydrostatic bearing for guiding movement of said scanning means.

12. An exposure apparatus for printing a pattern on a first object onto a second object, said apparatus comprising:
   carrying means for carrying the first object;
   illuminating means for illuminating the second object through the first object;
   stage means for holding the second object, said stage means being mounted on said carrying means and being movable relative thereto;
   base means for movably supporting said carrying means in a first direction, said illuminating means being fixed to said base means in a prescribed relationship;
   indicating means for indicating a location of the second object held on said stage means, said indicating means being mounted on said stage means;
   first measuring means for measuring the location of said indicating means, said first measuring means being mounted on said carrying means;
   second measuring means for measuring the location of said indicating means with respect to a second direction different from the first direction when said carrying means is moved in the first direction, said second measuring means being mounted on said base means; and
   determining means for determining inclination of said indicating means relative to the first and second directions when said carrying means is moved in the first direction, based on a movement distance of said carrying means and a value measured by said second measuring means.

13. An exposure apparatus according to claim 12, further comprising a hydrostatic bearing, and wherein said base means movably supports said carrying means through said hydrostatic bearing.

14. An exposure apparatus according to claim 12, wherein said indicating means comprises a right-angled mirror.

15. An exposure apparatus according to claim 12, wherein said stage means is movable in the first and second directions and rotatable in a plane containing the first and second directions.

16. An apparatus for exposing, in sequence, different portions of an exposure body to a pattern with radiation, said apparatus comprising:
    means for exposing, one at a time, each one of the different portions of the exposure body to the pattern with radiation;
    holding means for movably holding the exposure body;
    carrying means for carrying said holding means;
    supporting means for slidably supporting said carrying means in a first direction;
    indicating means for indicating a location of the exposure body held by said holding means, said indicating means being mounted on said holding means;
    measuring means for measuring displacement of said indicating means in a second direction different from the first direction when said carrying means is slid in the first direction by a prescribed amount, said measuring means being mounted on said supporting means; and
    controlling means for controlling said holding means to cause said holding means to place, in sequence, the different portions of the exposure in a predetermined exposure station, taking into account the measured displacement of said indicating means and the prescribed amount of sliding of said carrying means.

17. An exposure apparatus according to claim 16, wherein said controlling means comprises means for calculating an inclination of said indicating means relative to the first and second directions based on the measured displacement of said indicating means and the prescribed amount of sliding of said carrying means.

18. An exposure apparatus according to claim 16, further comprising an optical interference device cooperating with said indicating means, and wherein said measuring means measures the displacement of said indicating means by said optical interference device.

19. An exposure apparatus according to claim 16, further comprising a hydrostatic bearing, and wherein said carrying means is supported by said supporting means through said hydrostatic bearing.

20. An apparatus accroding for measuring movement of an object, said apparatus comprising:
    holding means for movably holding an object, said holding means comprising a first stage movable rectilinearly and a second stage movable rotationally;
    carrying means for carrying said holding means;
    supporting means for slidably supporting said carrying means in a first direction;
    indicating means for indicating a location of the object held by said holding means, said indicating means being mounted on said holding means; and
    measuring means for measuring displacement of said indicating means in a second direction different from the first direction when said carrying means is slid in the first direction by a prescribed amount, said measuring means being mounted on said supporting means.

21. An apparatus according to claim 20, further comprising means for detecting inclination of said indicating means relative to the first and second directions based on the measured displacement of said indicating means and the prescribed amount of sliding of said carrying means.

22. An apparatus according to claim 20, wherein said first stage is movable rectilinearly in two mutually orthogonal directions which are the first and second directions.

23. An exposure apparatus according to claim 20, further comprising a hydrostatic bearing, and wherein said carrying means is supported by said supporting means through said hydrostatic bearing.

* * * * *

UNITED STATES PATENT AND TRADEMARK OFFICE
CERTIFICATE OF CORRECTION

PATENT NO. : 5,150,152
DATED : September 22, 1992
INVENTOR(S) : Junji Isohata, et al.

It is certified that error appears in the above-identified patent and that said Letters Patent is hereby corrected as shown below:

COLUMN 1

Line 38, "each" should read --each of--; and
    Line 42, "wil" should read --will--.

COLUMN 2

Line 54, "X-and" should read --X- and--.

COLUMN 3

Line 22, "will" should be deleted; and
    Line 53, "0.5",so" should read --0.5", so--.

COLUMN 5

Line 7, "in" should read --to--; and
    Line 28, "claim and drawing." should read --claims and drawings.--.

COLUMN 6

Line 52, "as" should read --an--.

COLUMN 7

Line 6, "a" should be deleted; and
    Line 53, "floatingly," should read --floatingly--.

UNITED STATES PATENT AND TRADEMARK OFFICE
CERTIFICATE OF CORRECTION

PATENT NO. : 5,150,152

DATED : September 22, 1992

INVENTOR(S) : Junji Isohata, et al.

It is certified that error appears in the above-identified patent and that said Letters Patent is hereby corrected as shown below:

COLUMN 8

Line 51, "above," should read --above--; and
    Line 60, "this" should read --thus--.

COLUMN 9

Line 62, "first measuring means" should read --said first measuring means--.

COLUMN 11

Line 35, "exposure" should read --exposure body--.

COLUMN 12

Line 12, "accroding" should be deleted; and
    Line 40, "exposure" should be deleted.

Signed and Sealed this

Twenty-sixth Day of October, 1993

Attest:

BRUCE LEHMAN

Attesting Officer     Commissioner of Patents and Trademarks